(12) United States Patent
Liu et al.

(10) Patent No.: US 11,800,744 B2
(45) Date of Patent: Oct. 24, 2023

(54) DISPLAY PANEL AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Bowen Liu, Beijing (CN); Yubao Kong, Beijing (CN); Xuewu Xie, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 203 days.

(21) Appl. No.: 17/255,658

(22) PCT Filed: Mar. 31, 2020

(86) PCT No.: PCT/CN2020/082543
§ 371 (c)(1),
(2) Date: Dec. 23, 2020

(87) PCT Pub. No.: WO2020/238397
PCT Pub. Date: Dec. 3, 2020

(65) Prior Publication Data
US 2021/0273202 A1   Sep. 2, 2021

(30) Foreign Application Priority Data
May 30, 2019   (CN) .......................... 201910461034.3

(51) Int. Cl.
*H01L 51/52* (2006.01)
*H10K 50/856* (2023.01)
(Continued)

(52) U.S. Cl.
CPC ......... *H10K 50/856* (2023.02); *H10K 59/122* (2023.02); *H10K 71/00* (2023.02); *H10K 59/1201* (2023.02)

(58) Field of Classification Search
CPC .. H01L 27/3246; H01L 51/5271; H01L 51/56
(Continued)

(56) References Cited

U.S. PATENT DOCUMENTS 8,921,839 B2   12/2014   Zhang et al.
2008/0032039 A1*  2/2008   Murata ............... H01L 27/3283
                                                              427/66

(Continued)

FOREIGN PATENT DOCUMENTS

CN   103022079 A   4/2013
CN   105304679 A   2/2016
(Continued)

OTHER PUBLICATIONS

International search report of PCT application No. PCT/CN2020/082543 dated Jul. 3, 2020.
(Continued)

*Primary Examiner* — Dzung Tran
(74) *Attorney, Agent, or Firm* — Lippes Mathias LLP (57) ABSTRACT

A display panel includes a first defining layer, a first recessed layer, a flat layer, and a pixel unit layer that are laminated on a base substrate in sequence. The pixel unit layer includes a plurality of sub-pixels. The first defining layer defines one or more defining regions on the base substrate, and the one or more defining regions corresponding to part or all of the plurality of sub-pixels. A surface of the first recessed layer in each defining region is recessed.

13 Claims, 6 Drawing Sheets

(51) Int. Cl.
*H10K 59/122* (2023.01)
*H10K 71/00* (2023.01)
*H10K 59/12* (2023.01)

(58) Field of Classification Search
USPC .......................................................... 257/40
See application file for complete search history.

(56) References Cited

U.S. PATENT DOCUMENTS

| | | | |
|---|---|---|---|
| 2009/0239045 A1* | 9/2009 | Kato | C09D 179/02 |
| | | | 427/256 |
| 2011/0089412 A1* | 4/2011 | Fujimori | H01L 51/0013 |
| | | | 257/E51.027 |
| 2014/0159021 A1 | 6/2014 | Song et al. | |
| 2014/0264291 A1 | 9/2014 | Zhang et al. | |
| 2014/0312312 A1* | 10/2014 | Takii | H10K 71/00 |
| | | | 438/34 |
| 2017/0092707 A1 | 3/2017 | Wang | |
| 2018/0097195 A1 | 4/2018 | Inoue et al. | |
| 2019/0165085 A1* | 5/2019 | Choi | H01L 51/5271 |
| 2019/0173028 A1 | 6/2019 | Wang et al. | |
| 2020/0075879 A1 | 3/2020 | Luo et al. | |

FOREIGN PATENT DOCUMENTS

| | | |
|---|---|---|
| CN | 107535033 A | 1/2018 |
| CN | 108039420 A | 5/2018 |
| CN | 109148727 A | 1/2019 |
| CN | 110085655 A | 8/2019 |
| JP | 2003229283 A | 8/2003 |
| JP | 2005062400 A | 3/2005 |

OTHER PUBLICATIONS

First office action of Chinese application No. 201910461034.3 dated Aug. 4, 2020.

Notification to grant patent right for invention of Chinese application No. 201910461034.3 dated Dec. 17, 2020.

* cited by examiner

DISPLAY PANEL AND DISPLAY APPARATUS

CROSS-REFERENCE TO RELATED APPLICATION

The present disclosure is a 371 of PCT Application No. PCT/CN2020/082543, filed on Mar. 31, 2020, which claims priority to Chinese Patent application No. 201910461034.3, filed on May 30, 2019, and titled "Display Panel, Manufacturing Method thereof, and Display Apparatus", which is incorporated herein by reference in its entirety.

TECHNICAL FIELD

The present disclosure relates to a display panel, a manufacturing method thereof, and a display apparatus.

BACKGROUND

With the development of display technologies, Organic Light-Emitting Diode (OLED) display apparatuses have been widely used.

OLED display apparatus includes at least a cathode layer, an electron transporting layer, a light emitting layer, a hole transporting layer, and an anode layer. Generally, there are other organic film layers on both sides of the light emitting layer. For example, there is an electron injection layer between the cathode layer and the electron transporting layer.

SUMMARY

In an aspect, a display panel is provided. The display panel includes a first defining layer, a first recessed layer, a flat layer, and a pixel unit layer which are laminated on a base substrate in sequence, the pixel unit layer including a plurality of sub-pixels, wherein the first defining layer defines one or more defining regions on the base substrate, the one or more defining regions correspond to part or all of the plurality of sub-pixels, and a surface of the first recessed layer in each defining region is recessed.

In another aspect, a method for manufacturing a display panel is provided. The method includes: forming a first defining layer on a base substrate, the first defining layer defining one or more defining regions on the base substrate; forming a first recessed layer on the base substrate having the formed first defining layer, and a surface of the first recessed layer in each defining region being recessed; forming a flat layer on the base substrate having the formed first recessed layer; and forming a pixel unit layer on the base substrate having the formed flat layer, the pixel unit layer including a plurality of sub-pixels, part or all of the plurality of sub-pixels corresponding to the one or more defining regions.

In yet another aspect, a display apparatus is provided, and the display apparatus includes the display panel described in the first aspect.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

In order to make the objectives, technical solutions, and advantages of the present disclosure clearer, the following further describes the embodiments of the present disclosure in detail with reference to the accompanying drawings.

Generally, an OLED display apparatus includes a cathode layer, an electron transporting layer, a light emitting layer, a hole transporting layer, and an anode layer which are laminated on a base substrate. The electron transporting layer and the hole transporting layer are usually made of organic material, and the refractive index of the organic material is about 1.7. The base substrate is mainly made of silicon dioxide with the refractive index of about 1.5. The refractive index of air is about 1. When light is incident from a medium with a higher refractive index into a medium with a lower refractive index, total reflection is more likely to occur. Therefore, when the light emitted by the light emitting layer is incident into the air at a light emitting surface of the OLED display apparatus through the organic film layer or the base substrate, a part of the light will be totally reflected, causing the part of the light to be unable to be emitted from the OLED display apparatus, and thus less light are emitted from the light emitting surface of the OLED display apparatus into the air. For example, 20% of the light emitted by the light emitting layer can be emitted into the air from the light emitting surface of the OLED display apparatus, but 80% of the light emitted by the light emitting layer is lost, resulting in low light emitting efficiency of the OLED display apparatus.

Figure 1:
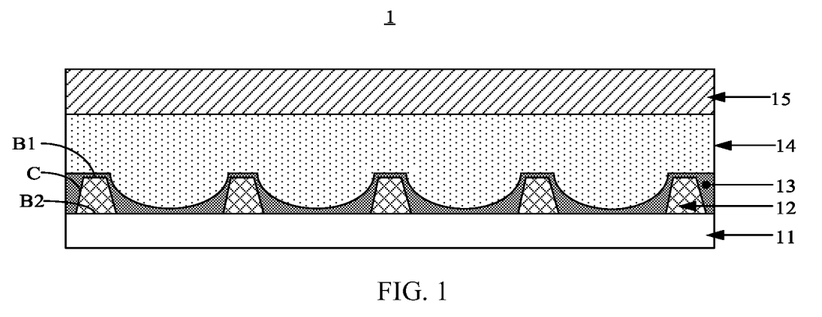
FIG. 1 is a schematic structural diagram of a display panel provided by an embodiment of the present disclosure.

An embodiment of the present disclosure provides a display panel with higher light emitting efficiency. As shown in FIG. 1, the display panel 1 may include a first defining layer 12, a first recessed layer 13, a flat layer 14 and a pixel unit layer 15 which are laminated on a base substrate 11 in sequence. The pixel unit layer 15 may include a plurality of pixel units, and each pixel unit may include at least two sub-pixels. The at least two sub-pixels emit light with different colors. For example, the pixel unit may include two sub-pixels, the two sub-pixels may include a red sub-pixel and a green sub-pixel. Alternatively, the pixel unit may include three sub-pixels, and the three sub-pixels may include a red sub-pixel, a green sub-pixel and a blue sub-pixel, which are not limited in the embodiments of the present disclosure.

The first defining layer 12 defines one or more defining regions on the base substrate 11, and the one or more defining regions correspond to part or all of the plurality of sub-pixels in the pixel unit layer 15.

A surface of the first recessed layer 13 in each defining region is recessed.

In summary, the display panel provided by the embodiment of the present disclosure includes a first defining layer and a first recessed layer. The surface of the first recessed layer in each defining region is recessed. Compared with the related art, the recessed surface of the first recessed layer changes the incident angle of the light which is emitted by the sub-pixel and illuminates the first recessed layer, and changes the propagation path of the light, so that the amount of light totally reflected can be reduced, and the amount of light emitted from the light emitting side of the display panel in the light emitted by the sub-pixel can be increased, thereby improving the light emitting efficiency of the display panel.

Optionally, the orthographic projection of the sub-pixel on the base substrate 11 may cover the orthographic projection of a portion of the first recessed layer 13 located in the defining region corresponding to the sub-pixel on the base substrate 11. In this case, the portion of the first recessed layer located in each defining region acts on the light emitted by the corresponding sub-pixel, for example, to change the optical path of the light emitted by the corresponding sub-pixel, and to make the light emitted by other sub-pixels be unable to be emitted to the current defining region. The probability of crosstalk between the light emitted by the sub-pixel and the light emitted by other sub-pixels is reduced, and the color purity of the light emitted by the display panel can be guaranteed, thereby improving the display effect of the display panel.

In addition, the orthographic projection of the portion of the first recessed layer in the defining region on the base substrate has a first geometric center, and the orthographic projection of the sub-pixel corresponding to the defining region on the base substrate has a second geometric center. The first geometric center may coincide with the second geometric center. And/or, a symmetry axis of the orthographic projection of the portion of the first recessed layer in the defining region on the base substrate may coincide with a symmetry axis of the orthographic projection of the sub-pixel corresponding to the defining region on the base substrate. In this way, the light emitted by the sub-pixel can be more emitted to the portion of the first recessed layer in the corresponding defining region, thereby reducing the probability that the light emitted by the sub-pixel is emitted to the portions of the first recessed layer in other defining regions and reducing the probability of crosstalk between the light emitted by the sub-pixel and the light emitted by other sub-pixels.

For example, the orthographic projection of any sub-pixel on the base substrate 11 may overlap with the orthographic projection of the portion of the first recessed layer 13 located in the defining region corresponding to the sub-pixel on the base substrate 11. Under the premise that the light emitted by two adjacent sub-pixels does not crosstalk, the portion of the first recessed layer 13 in the defining region has a greater surface area, so that the light emitted by the sub-pixel can be emitted to the surface of the first recessed layer 13 located in the corresponding defining region as much as possible. The amount of light with changed optical paths can be increased, thereby further increasing the amount of light emitted from the light emitting side of the display panel in light emitted by the sub-pixels.

Further, the first recessed layer 13 may be made of a reflective material. The reflective material may be an organic material or an inorganic material. For example, the first recessed layer 13 may be made of metal, such as aluminum or copper. In this case, the first recessed layer 13 can reflect the light irradiating the surface of the first recessed layer to the light emitting side of the display panel, the amount of light emitted from the light emitting side of the display panel in the light emitted by the sub-pixels can be increased and the light emitting efficiency of the display panel is further improved.

Optionally, as shown in FIG. 1, the orthographic projection of the surface B1 of the first defining layer 12 away from the base substrate 11 on the base substrate 11 may fall within the orthographic projection of the surface B2 of the first defining layer 12 close to the base substrate 11 on the base substrate 11. In this case, the side surfaces (for example, side surfaces C in FIG. 1) of the first defining layer 12 may be arranged obliquely with respect to the base substrate 11. When the first recessed layer is manufactured, the material for manufacturing the first recessed layer 13 is easier to adhere to the side surfaces of the first defining layer 12, the surface of the formed first recessed layer 13 in each defining region is recessed. Alternatively, the side surfaces of the first defining layer 12 may be perpendicular to the base substrate 11, which is not limited in the embodiments of the present disclosure.

Further, the first defining layer 12 may have hydrophilic characteristics. For example, the first defining layer 12 may be made of a hydrophilic material, such as polyimide. After the first defining layer 12 is formed, the first defining layer 12 may be subjected to a hydrophilic treatment to enhance the hydrophilicity of the first defining layer 12. For example, when the first defining layer 12 is made of polyimide, the first defining layer 12 may be subjected to ion bombardment treatment.

Alternatively, the display panel may further include a hydrophilic treatment layer, which is a hydrophilic film coated on the surface of the first defining layer 12, and the hydrophilicity of the hydrophilic film is greater than that of the first defining layer 12. When the cost of manufacturing materials with hydrophilic characteristics is high, by coating the hydrophilic treatment layer on the surface of the first defining layer 12, not only can the film layer be manufactured on the film layer surface having the hydrophilic characteristic, but also the manufacturing cost of the display panel can be effectively reduced.

Figure 2:
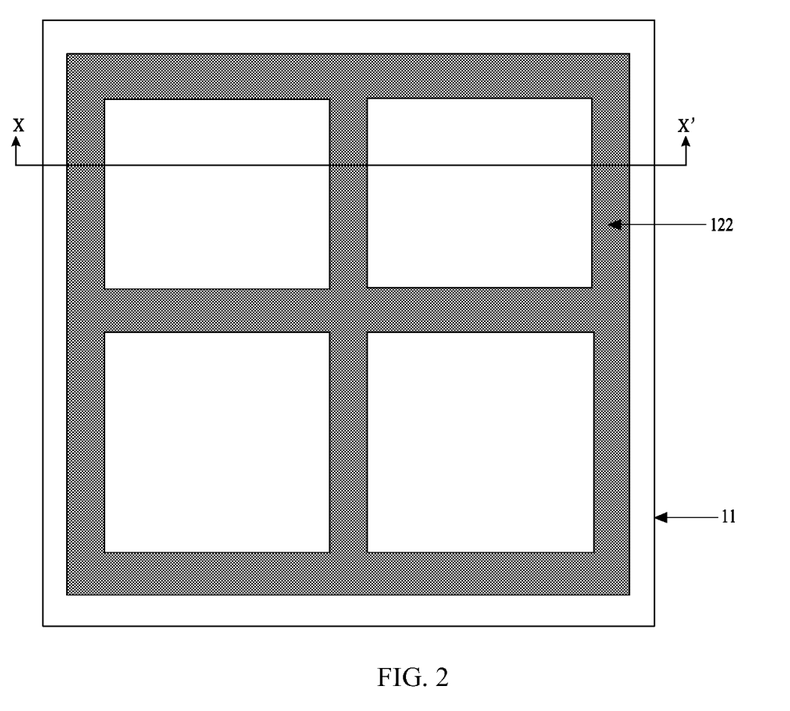
FIG. 2 is a schematic structural diagram of another display panel provided by an embodiment of the present disclosure.
Figure 3:
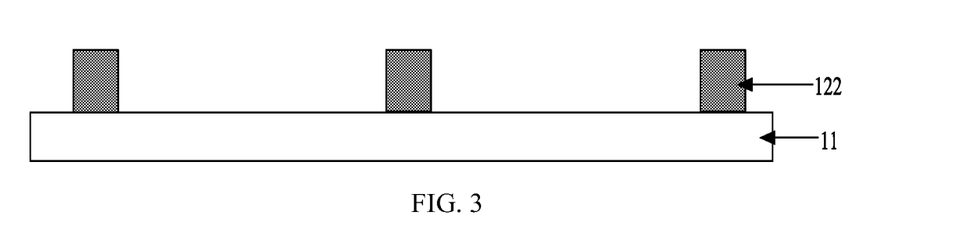
FIG. 3 is a schematic sectional view of the structure in FIG. 2 at position XX'.

Optionally, the first defining layer 12 may be configured as a grid-like structure, and each grid of the grid-like structure is configured to define a defining region. For example, as shown in FIGS. 2 and 3, a grid-like structure 122 defines four defining regions. FIG. 3 is a schematic sectional view taken at position XX' in FIG. 2. The grid-like structure of the first defining layer allows the manufacturing material of the first recessed layer to have a larger contact area with the first defining layer, which increases the amount of manufacturing material adhered to the first defining layer, so that the surface of the first recessed layer in each defining region may be recessed.

It should be noted that the first defining layer 12 may be an integral structure. In this case, the first defining layer 12 may be manufactured through one-time patterning process. For example, the grid-like first defining layer 12 may be an integral structure.

Figure 4:
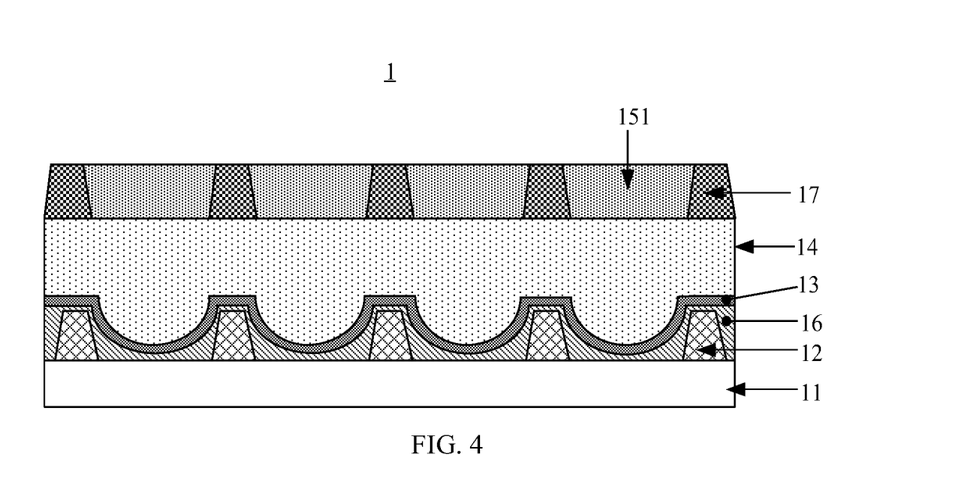
FIG. 4 is a schematic structural diagram of still another display panel provided by an embodiment of the present disclosure.

Optionally, as shown in FIG. 4, the display panel 1 may further include a second recessed layer 16 located between the first defining layer 12 and the first recessed layer 13, and a surface of the second recessed layer 16 in each defining region is recessed. In this case, since the surface of the second recessed layer 16 in the defining region is recessed, after a first recessed layer 13 with a certain thickness is formed on the surface of the second recessed layer 16, the surface of the first recessed layer 13 is recessed. The requirements on the manufacturing process of the first recessed layer 13 can be reduced, so that suitable manufacturing processes can be adopted for different manufacturing materials to form the first recessed layer 13, and the process difficulty in forming the first recessed layer 13 is reduced. For example, the first recessed layer 13 may be formed on the second recessed layer 16 by a common film forming process (such as evaporation).

In addition, the orthographic projection of the sub-pixel 151 on the base substrate 11 may cover the orthographic projection of the portion of the second recessed layer 16 located in the defining region corresponding to the sub-pixel 151 on the base substrate 11. In this way, when the first recessed layer 13 is formed on the second recessed layer 16, the orthographic projection of the sub-pixel on the base substrate 11 can cover the orthographic projection of the portion of the formed first recessed layer 13 located in the corresponding defining region on the base substrate 11, thereby reducing the probability of crosstalk between the light emitted by the sub-pixel and the light emitted by other sub-pixels.

Figure 5:
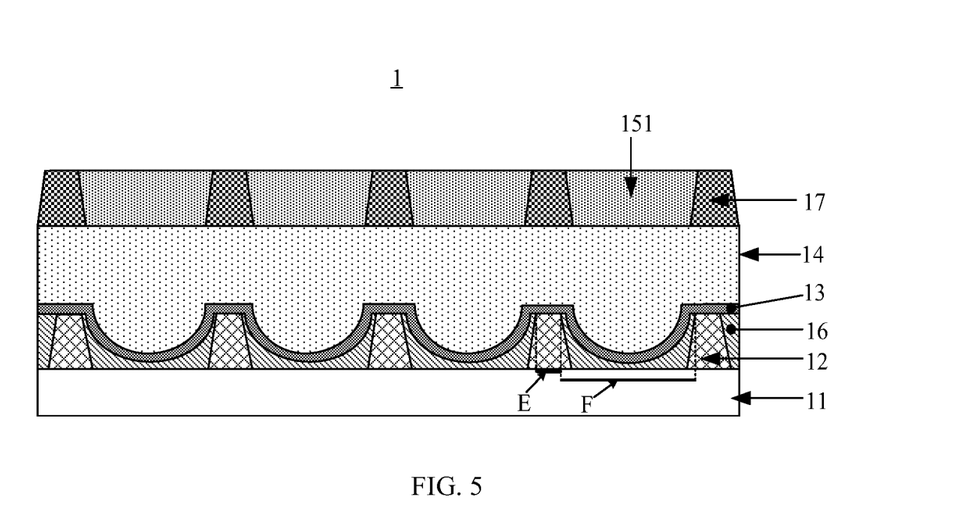
FIG. 5 is a schematic structural diagram of yet another display panel provided by an embodiment of the present disclosure.

Further, as shown in FIG. 5, the orthographic projection E of the surface of the first defining layer 12 away from the base substrate 11 on the base substrate 11 may not be overlapped with the orthographic projection F of the second recessed layer 16 on the base substrate 11. In this case, the first recessed layer 13 is in direct contact with the surface of the first defining layer 12 away from the base substrate 11. In one aspect, the overall thickness of the display panel can be reduced, which is conducive to the lighting and thinning of the display panel, and in another aspect the source material required for the formation of the second recessed layer can be reduced.

In addition, since the second recessed layer 16 is mainly used to support the first recessed layer 13, the material selection requirements for the manufacturing material of the second recessed layer 16 are relatively low. For example, organic materials or inorganic materials may be used, so that the second recessed layer 16 may be formed by multiple film forming processes, and the process requirements for forming the second recessed layer 16 are relatively low.

Optionally, a solution process can be used to form the second recessed layer. For example, the second recessed layer is formed by inkjet printing, the formation process thereof may be as follows: first spraying a solution with the dissolved second recessed layer material on each defining region; then drying the solution to make the solvent in the solution be evaporated, with the second recessed layer material in the solution deposited on the side surfaces of the first defining layer and the base substrate, thereby forming the second recessed layer.

In addition, during the drying of the solution with the dissolved second recessed layer material, since it is affected by the factors such as surface tension, capillary action and Marangoni convection, the undried solution is easier to flow toward the region where the dried solution is located. Since the solution on the side surfaces of the first defining layer is thinner, the solvent of the solution on the side surfaces of the first defining layer dries faster, which in turn makes the undried liquid more prone to flow toward the side surfaces of the first defining layer, such that more solute is left near the side surfaces of the first defining layer. That is, a thicker film layer is formed near the side surfaces of the first defining layer, and a thinner film layer is formed away from the side surfaces of the first defining layer, so that the formed second recessed layer appears a relatively significant concave shape in the defining region. The phenomenon that the second recessed layer appears this shape in the defining region is generally called a coffee ring phenomenon.

When the display panel 1 includes the second recessed layer 16, since the surface of the second recessed layer 16 in each defining region is recessed, a first recessed layer 13 with a certain thickness may be formed on the second recessed layer 16. The thickness of the first recessed layer 13 can be set according to the light transmittance of the first recessed layer material to ensure that the first recessed layer is opaque and prevent the light emitted to the first recessed layer from passing through the first recessed layer.

Referring to FIG. 4 or FIG. 5, the display panel 1 may further include a second defining layer 17. The second defining layer 17 is located on a side of the flat layer 14 away from the base substrate 11, and the second defining layer 17 is configured to define a plurality of pixel regions. Each sub-pixel 151 is located in one pixel region, and each sub-pixel 151 may include an anode layer, a light emitting layer, a cathode layer and the like, which are laminated.

In summary, a display panel provided by an embodiment of the present disclosure includes a first defining layer and a first recessed layer. The surface of the first recessed layer in each defining region is recessed, and the first recessed layer can reflect light. Compared with the related art, in one aspect, the recessed surface of the first recessed layer changes the incident angle of the light which is emitted by the sub-pixel and illuminates the first recessed layer, and changes the propagation path of the light, so that the amount of light totally reflected can be reduced. In one aspect, the first recessed layer can reflect the light emitted to the surface of the first recessed layer to the light emitting side of the display panel, that is, the first recessed layer can increase the amount of light emitted from the light emitting side of the display panel in the light emitted by the sub-pixel, thereby improving the light emitting efficiency of the display panel.

Figure 6:
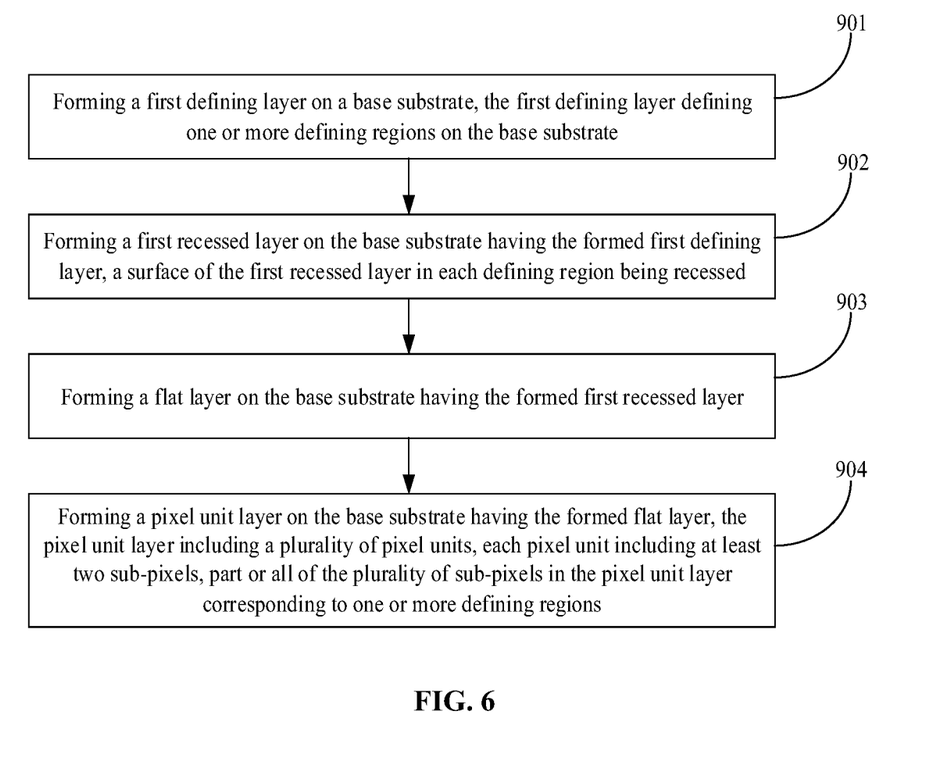
FIG. 6 is a flowchart of a method for manufacturing a display panel provided by an embodiment of the present disclosure.

An embodiment of the present disclosure provides a method for manufacturing a display panel, which is used to manufacture the display panel in the above embodiments. As shown in FIG. 6, the method for manufacturing the display panel includes the following steps.

In step 901, a first defining layer is formed on a base substrate, and the first defining layer defines one or more defining regions on the base substrate.

In step 902, a first recessed layer is formed on the base substrate having the formed first defining layer, and a surface of the first recessed layer in each defining region is recessed.

In step 903, a flat layer is formed on the base substrate having the formed first recessed layer.

In step 904, a pixel unit layer is formed on the base substrate having the formed flat layer, the pixel unit layer includes a plurality of pixel units, each pixel unit includes at least two sub-pixels, and part or all of the plurality of sub-pixels in the pixel unit layer corresponds to one or more defining regions.

In summary, the embodiment of the present disclosure provides a method for manufacturing a display panel. The manufactured display panel includes a first defining layer and a first recessed layer. The surface of the first recessed layer in each defining region is recessed. Compared with the related art, the recessed surface of the first recessed layer changes the incident angle of the light which is emitted by the sub-pixel and illuminates the first recessed layer, and changes the propagation path of the light, so that the amount of light totally reflected can be reduced, thereby improving the light emitting efficiency of the display panel.

Optionally, an embodiment of the present disclosure takes the manufacture of the display panel shown in FIG. 5 as an example to describe the manufacturing method of the display panel.

Figure 7:
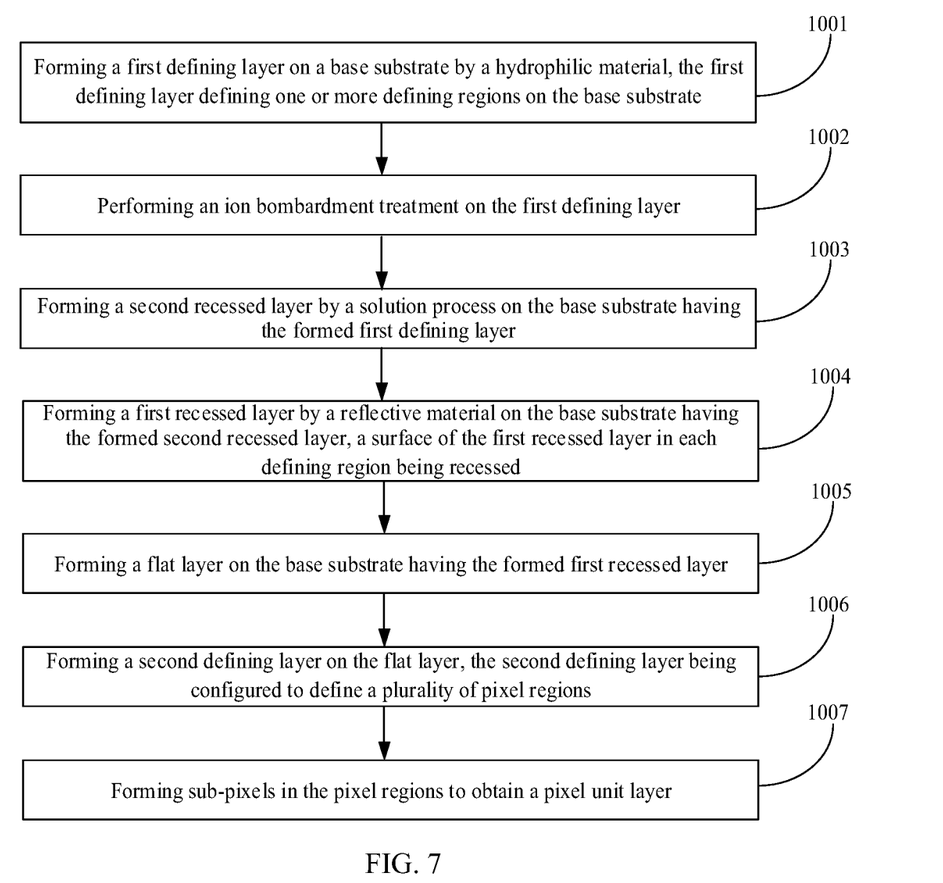
FIG. 7 is a flowchart of a method for manufacturing another display panel provided by an embodiment of the present disclosure.

FIG. 7 is a flowchart of another method for manufacturing a display panel provided by an embodiment of the disclosure. As shown in FIG. 7, the method for manufacturing the display panel includes the following steps.

In step 1001, a first defining layer is formed on a base substrate by using a hydrophilic material, and the first defining layer defines one or more defining regions on the base substrate.

A layer of hydrophilic material with hydrophilic property is deposited on the base substrate by magnetron sputtering, thermal evaporation, plasma enhanced chemical vapor deposition (PECVD) or other methods to obtain a hydrophilic material layer. Then, the hydrophilic material layer is patterned through one-time patterning process to obtain the first defining layer. One-time patterning process may include photoresist coating, exposure, development, etching and photoresist stripping. For example, the hydrophilic material may be polyimide.

Optionally, the first defining layer may include a plurality of defining structures arranged in an array. In this case, the connection line between each defining structure and the adjacent defining structure defines a defining region on the base substrate. Alternatively, the first defining layer is configured as a grid-like structure, and each grid is used to define a defining region. Further, the orthographic projection of the surface of the first defining layer away from the base substrate on the base substrate may be within the orthographic projection of the surface of the first defining layer close to the base substrate on the base substrate.

Figure 8:
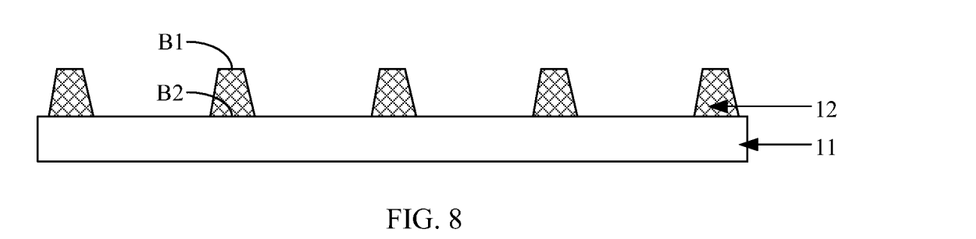
FIG. 8 is a schematic structural diagram provided by an embodiment of the present disclosure which shows that a first defining layer is formed on a base substrate.

In an example, after step 1001 is executed, the structure shown in FIG. 8 can be obtained. As shown in FIG. 8, the orthographic projection of the surface B1 of the first defining layer 12 away from the base substrate 11 on the base substrate 11 is within the orthographic projection of the surface B2 of the first defining layer 12 close to the base substrate 11 on the base substrate 11.

In step 1002, an ion bombardment treatment is performed on the first defining layer.

After the first defining layer is formed on the base substrate, the surface of the first defining layer may be subjected to an ion bombardment treatment to enhance the hydrophilic ability of the first defining layer, so that when the second recessed layer is formed on the first defining layer by the solution process, the solution for manufacturing the second recessed layer can be adhered to the first defining layer better, so as to form the second recessed layer with a recessed surface in each defining region.

It should be noted that the ion bombardment treatment to the first defining layer is to enhance the hydrophilicity of the first defining layer. However, the implementation of enhancing the hydrophilicity of the first defining layer is not limited to the ion bombardment treatment, and other implementations are also possible. For example, the display panel may further include a hydrophilic treatment layer, which is a hydrophilic film coated on the surface of the first defining layer, and the hydrophilicity of the hydrophilic film is greater than that of the first defining layer. In this case, after forming the first defining layer, a hydrophilic treatment layer may be first formed on the base substrate with the formed first defining layer, and then a first recessed layer and other subsequent film layers may be formed on the hydrophilic treatment layer. When the cost of manufacturing materials with hydrophilic characteristics is high, by coating a hydrophilic treatment layer on the surface of the first defining layer 12, not only can the film layer be manufactured on the film layer surface with hydrophilic characteristic, but also the manufacturing cost of the display panel can be effectively reduced.

In step 1003, a second recessed layer is formed on the base substrate having the formed first defining layer by a solution process.

The surface of the second recessed layer in each defining region is recessed, and the orthographic projection of the sub-pixel on the base substrate covers the orthographic projection of the portion of the second recessed layer located in the defining region corresponding to the sub-pixel on the base substrate.

After the ion bombardment treatment to the first defining layer, a second recessed layer may be formed on the base substrate having the formed first defining layer by a solution process. The process of forming the second recessed layer by the solution process may include: first injecting a solution with the dissolved second recessed layer material on the defining region, and then drying the solution, so that the solvent in the solution is evaporated, with the second recessed layer material in the solution is deposited on the side surfaces of the first defining layer and the base substrate, thereby forming the second recessed layer.

Since the first defining layer has hydrophilic characteristics, a part of the solution with the dissolved second recessed layer material may be adhered to the side surfaces of the first defining layer, and the other part of the solution with the dissolved second recessed layer material is located on the surface of the base substrate. In this case, when the solution is dried, the second recessed layer with a recessed surface may be formed in each defining region. Moreover, since the operation of the solution process is simple, forming the second recessed layer by the solution process can reduce the manufacturing difficulty of the display panel.

Optionally, the solution process can be implemented in multiple ways, such as inkjet printing. The process of forming the second recessed layer by inkjet printing may include: first spraying a solution with the dissolved second recessed layer material into each defining region; and then drying the solution, so that the solvent in the solution is evaporated, the second recessed layer material in the solution is deposited on the side surfaces of the first defining layer and the base substrate to form the second recessed layer. Since the first defining layer has hydrophilic characteristics, the solution in the defining region is easier to adhere to the first defining layer.

In addition, during the drying of the solution with the dissolved second recessed layer material, the undried solution is prone to flow toward the region where the dried solution is located since it is affected by the factors such as surface tension, capillary action, and Marangoni convection. The solvent of the solution on the side surfaces of the first defining layer dries faster, so that the undried liquid is more prone to flow toward the side surfaces of the first defining layer, leaving more solute near the side surfaces of the first defining layer. That is, a thicker film layer is formed near the side surfaces of the first defining layer, and a thinner film layer is formed away from the side surfaces of the first defining layer, so that the formed second recessed layer appears a relatively significant concave shape in the defining region. The phenomenon that the second recessed layer appears this shape in the defining region is generally called a coffee ring phenomenon.

Optionally, the orthographic projection of the surface of the first defining layer away from the base substrate on the base substrate may not be overlapped with the orthographic projection of the second recessed layer on the base substrate. Alternatively, the second recessed layer may completely cover the surface of the first defining layer.

Figure 9:
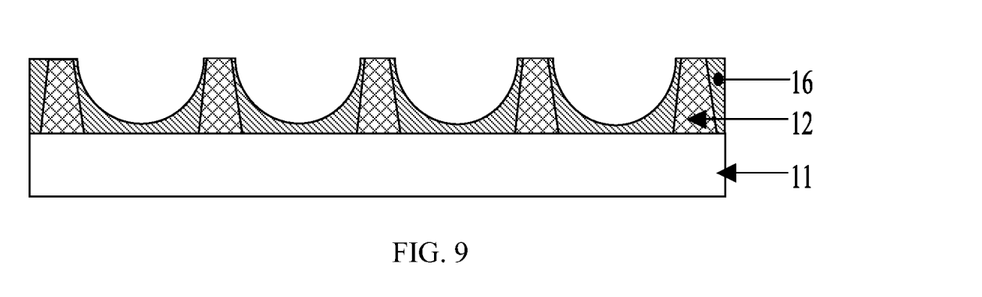
FIG. 9 is a schematic structural diagram provided by an embodiment of the present disclosure which shows that a second recessed layer is formed on the base substrate having the formed first defining layer.

In an example, after step 1003 is executed, the structure shown in FIG. 9 can be obtained. As shown in FIG. 9, the surface of the second recessed layer 16 in each defining region is recessed, and the orthographic projection of the second recessed layer 16 on the base substrate 11 is not overlapped with the orthographic projection of the surface of the first defining layer 12 away from the base substrate 11 on the base substrate.

In step 1004, a first recessed layer is formed on the base substrate having the formed second recessed layer by a reflective material, and the surface of the first recessed layer in each defining region is recessed.

The first recessed layer material with a certain thickness may be formed on the base substrate having the formed second recessed layer by evaporation to obtain the first recessed layer. The thickness of the first recessed layer can be set according to actual needs. For example, the thickness of the first recessed layer can be set according to the light transmittance of the first recessed layer material to ensure that the first recessed layer is opaque and prevent the light emitted to the first recessed layer from passing through the first recessed layer.

Optionally, the orthographic projection of the sub-pixel on the base substrate may cover the orthographic projection of the portion of the first recessed layer located in the defining region corresponding to the sub-pixel on the base substrate. For example, the orthographic projection of the portion of the first recessed layer in any defining region on the base substrate has a first geometric center, and the orthographic projection of the sub-pixel corresponding to any defining region on the base substrate has a second geometric center. The first geometric center may coincide with the second geometric center. And/or, a symmetry axis of the orthographic projection of the portion of the first recessed layer in the defining region on the base substrate may coincide with a symmetry axis of the orthographic projection of the sub-pixel corresponding to the defining region on the base substrate. And/or, the orthographic projection of the portion of the first recessed layer in the defining region on the base substrate may coincide with the orthographic projection of the sub-pixel corresponding to the defining region on the base substrate. In this way, more light emitted by the sub-pixel can be emitted to the portion of the corresponding first recessed layer in the defining region, thereby reducing the probability that the light emitted by the sub-pixel is emitted to the portions of the first recessed layer in the other defining regions, and reducing the probability of the crosstalk between the light emitted by the sub-pixel and the light emitted by other sub-pixels.

Figure 10:
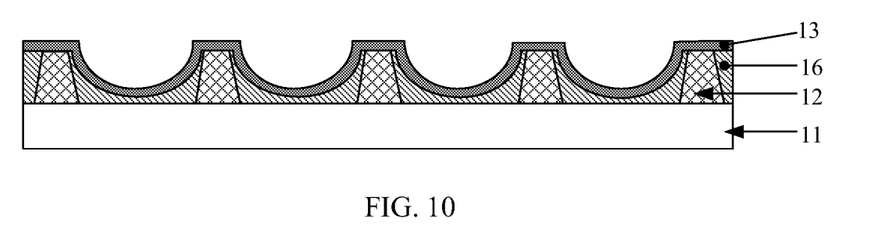
FIG. 10 is a schematic structural diagram provided by an embodiment of the present disclosure which shows that a first recessed layer is formed on the base substrate having the formed second recessed layer.

In an example, after step 1004 is executed, the structure shown in FIG. 10 can be obtained. As shown in FIG. 10, the surface of the first recessed layer 13 in each defining region is recessed, and the shape of the recessed surface and the shape of the surface of the second recessed layer 16 in the defining region may be similar. Moreover, when the orthographic projection of the surface of the first defining layer away from the base substrate on the base substrate is not overlapped with the orthographic projection of the second recessed layer on the base substrate, the first recessed layer 13 is in direct contact with the surface of the first defining layer 12 away from the base substrate 11. In one aspect, the overall thickness of the display panel can be reduced, which is conducive to the lighting and thinning of the display panel. In another aspect, the source material required for forming the second recessed layer 16 can be reduced.

Compared with the implementation in the related art, where the metal sheet is flattened, deoxidized, polished, imprinted, and transferred to form a structure with a recessed shape, the difficulty of manufacturing the first recessed layer is reduced by this method of manufacturing the first recessed layer.

In step 1005, a flat layer is formed on the base substrate having the formed first recessed layer.

A layer of flat layer material with a certain thickness may be deposited on the base substrate having the formed first recessed layer by magnetron sputtering, thermal evaporation or PECVD and the like to obtain the flat material layer. Then, the flat material layer is patterned through one-time patterning process to obtain a flat layer. Optionally, the flat layer material and the thickness of the flat layer can be set according to actual needs.

Figure 11:
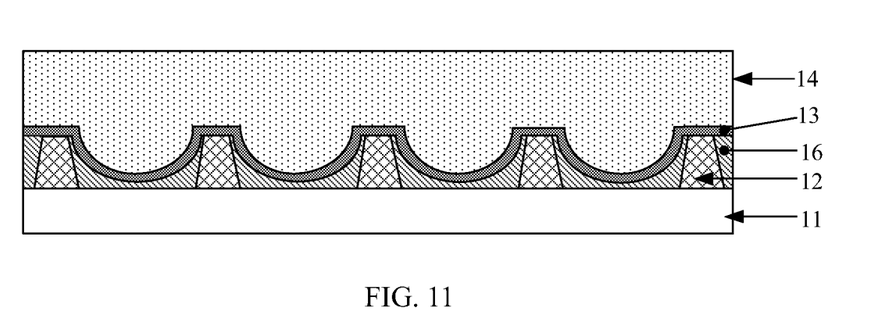
FIG. 11 is schematic structural diagram provided by an embodiment of the present disclosure which shows that a flat layer is formed on the base substrate having the formed first recessed layer.

In an example, after step 1005 is executed, the structure shown in FIG. 11 can be obtained. As shown in FIG. 11, the shape of the side of the flat layer 14 close to the base substrate 11 is complementary to the shape of the side of the first recessed layer 13 away from the base substrate 11, and the side of the flat layer 14 away from the base substrate 11 is a flat surface.

In step 1006, a second defining layer is formed on the flat layer, and the second defining layer is configured to define a plurality of pixel regions.

Figure 12:
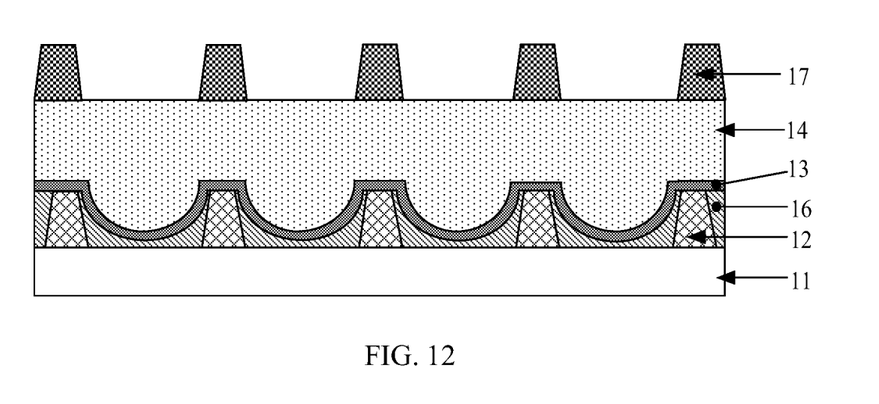
FIG. 12 is a schematic structural diagram provided by an embodiment of the present disclosure which shows that a second defining layer is formed on the base substrate having the formed flat layer.

A layer of second defining layer material with a certain thickness is deposited on the base substrate having the formed flat layer by magnetron sputtering, thermal evaporation, PECVD or the like to obtain the second defining material layer. Then, the second defining material layer is patterned through one-time patterning process to obtain a second defining layer. The second defining layer is configured for defining a plurality of pixel regions, and a sub-pixel is provided in the pixel region. The structure of the second defining layer 17 may be shown in FIG. 12. Optionally, the second defining layer material and the thickness of the second defining layer can be set according to actual needs. For example, the second defining layer may be made of an organic material.

In step 1007, sub-pixels are formed in the pixel regions to obtain a pixel unit layer.

Optionally, each sub-pixel may include an anode layer, a light emitting layer, and a cathode layer that are laminated. In this case, the anode layer, the light emitting layer, and the cathode layer may be sequentially formed in the pixel region by a patterning process, so as to form a sub-pixel and then obtain a pixel unit layer. The structure of the sub-pixel or the pixel unit layer may be that as shown in FIG. 7. The light emitting layer in the sub-pixel may at least include a hole injection layer, a hole transporting layer, a light emitting material layer, an electron transporting layer, and an electron injection layer, etc., and the thickness of each film layer can be set according to actual needs.

It should be noted that the anode layer in the sub-pixel may be formed before or after forming the second defining layer, which is not limited in the embodiments of the present disclosure.

In summary, the embodiment of the present disclosure provides a display panel manufactured by the method for manufacturing a display panel, which includes a first defining layer and a first recessed layer. The surface of the first recessed layer in each defining region is recessed, and the first recessed layer can reflect light. Compared with the related art, in one aspect, the recessed surface of the first recessed layer changes the incident angle of the light which is emitted by the sub-pixel and illuminates the first recessed layer, and changes the propagation path of the light, so that the amount of light totally reflected can be reduced. In another aspect, the first recessed layer can reflect the light emitted to the surface of the first recessed layer to the light emitting side of the display panel. That is, the first recessed layer can increase the amount of the light emitted from the light emitting side of the display panel in the light emitted by the sub-pixels, thereby improving the light emitting efficiency of the display panel.

It should be noted that the sequence of steps in the methods for manufacturing the display panel provided by the embodiments of the present disclosure may be adjusted appropriately, and the steps may be deleted or added according to the situation. Within the technical scope disclosed in the present disclosure, any variations of the method easily derived by a person skilled in the art shall fall within the protection scope of the present disclosure, which is not repeated here.

An embodiment of the present disclosure provides a display apparatus. The display apparatus may include a display panel in any of the above-mentioned embodiments. Optionally, the display apparatus may be a liquid crystal panel, electronic paper, organic light-emitting diode (OLED) display apparatus, mobile phone, tablet computer, television, monitor, notebook computer, digital photo frame, navigator or any apparatus or component with display function.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole description described above, like reference numerals denote like elements.

The term "and/or" in the embodiments of the present disclosure only describes the correspondence of the corresponding objects, indicating three kinds of relationship. For example, A and/or B, may be expressed as: A exists alone, A and B exist concurrently, B exists alone. In addition, the character "/" generally indicates that the context object is an "OR" relationship.

In the embodiments of the present disclosure, the terms "first" and "second" are used for descriptive purposes only and are not to be construed as indicating or implying relative importance. The term "plurality" refers to two or more, unless specifically defined otherwise.

The above are just the exemplary embodiments of the present disclosure, which will not limit the present disclosure. Any modifications, equivalent replacements and improvements made within the spirits and principles of the present disclosure shall all fall in the protection scope of the present disclosure.

What is claimed is:

1. A display panel, comprising: a first defining layer, a first recessed layer, a flat layer and a pixel unit layer that are laminated on a base substrate in sequence, the pixel unit layer comprising a plurality of sub-pixels;
wherein the first defining layer defines one or more defining regions on the base substrate, and the one or more defining regions correspond to part or all of the plurality of sub-pixels; and
a surface of the first recessed layer in each defining region is recessed;
the display panel further comprises a second recessed layer located between the first defining layer and the first recessed layer, and a surface of the second recessed layer in each defining region is recessed, an orthographic projection of each sub-pixel on the base substrate covers an orthographic projection of a portion of the second recessed layer located in the defining region corresponding to the sub-pixel on the base substrate, an orthographic projection of a surface, distal from the base substrate, of the first defining layer on the base substrate is not overlapped with an orthographic projection of the second recessed layer on the base substrate, such that the first recessed layer is in direct contact with the surface, distal from the base substrate, of the first defining layer; and
the display panel further comprises a second defining layer disposed on a side, distal from the base substrate, of the flat layer, the second defining layer is configured to define a plurality of pixel regions, and each sub-pixel is disposed in one of the plurality of pixel regions.

2. The display panel according to claim 1, wherein an orthographic projection of the sub-pixel on the base substrate covers an orthographic projection of a portion of the first recessed layer located in the defining region corresponding to the sub-pixel on the base substrate.

3. The display panel according to claim 1, wherein a geometric center of the orthographic projection of the portion of the first recessed layer in the defining region on the base substrate coincides with a geometric center of the orthographic projection of the sub-pixel corresponding to the defining region on the base substrate.

4. The display panel according to claim 1, an orthographic projection of a portion of the first recessed layer in the defining region on the base substrate coincides with an orthographic projection of the sub-pixel corresponding to the defining region on the base substrate.

5. The display panel according to claim 1, wherein the first recessed layer is made of a reflective material.

6. The display panel according to claim 5, wherein the first recessed layer is made of metal.

7. The display panel according to claim 1, wherein an orthographic projection of a surface of the first defining layer away from the base substrate on the base substrate falls within an orthographic projection of a surface of the first defining layer close to the base substrate on the base substrate.

8. The display panel according to claim 1, wherein the first defining layer is hydrophilic.

9. The display panel according to claim 1, wherein the display panel further comprises a hydrophilic treatment layer, the hydrophilic treatment layer covers a surface of the first defining layer away from the base substrate, and the hydrophilicity of the hydrophilic treatment layer is greater than that of the first defining layer.

10. The display panel according to claim 1, wherein the first defining layer is of a grid-like structure, and a grid of the grid-like structure defines the defining region.

11. A method for manufacturing a display panel, comprising:
   forming a first defining layer on a base substrate, the first defining layer defining one or more defining regions on the base substrate;
   forming a second recessed layer on the base substrate having the formed first defining layer, wherein a surface of the second recessed layer in each defining region is recessed;
   forming a first recessed layer on the base substrate having the formed second recessed layer, wherein a surface of the first recessed layer in each defining region is recessed, an orthographic projection of a surface, distal from the base substrate, of the first defining layer on the base substrate is not overlapped with an orthographic projection of the second recessed layer on the base substrate, such that the first recessed layer is in direct contact with the surface, distal from the base substrate, of the first defining layer;
   forming a flat layer on the base substrate having the formed first recessed layer;
   forming a second defining layer on the flat layer, wherein the second defining layer is configured to define a plurality of pixel regions;
   forming sub-pixels in the pixel regions to obtain a pixel unit layer, wherein an orthographic projection of each sub-pixel on the base substrate covers an orthographic projection of a portion of the second recessed layer located in the defining region corresponding to the sub-pixel on the base substrate.

12. The method according to claim 11, wherein the first recessed layer is made of a reflective material.

13. A display apparatus comprising a display panel, wherein the display panel comprises: a first defining layer, a first recessed layer, a flat layer and a pixel unit layer that are laminated on a base substrate in sequence, the pixel unit layer comprising a plurality of sub-pixels;
   wherein the first defining layer defines one or more defining regions on the base substrate, and the one or more defining regions correspond to part or all of the plurality of sub-pixels; and
   a surface of the first recessed layer in each defining region is recessed;
   the display panel further comprises a second recessed layer located between the first defining layer and the first recessed layer, and a surface of the second recessed layer in each defining region is recessed, an orthographic projection of each sub-pixel on the base substrate covers an orthographic projection of a portion of the second recessed layer located in the defining region corresponding to the sub-pixel on the base substrate, an orthographic projection of a surface, distal from the base substrate, of the first defining layer on the base substrate is not overlapped with an orthographic projection of the second recessed layer on the base substrate, such that the first recessed layer is in direct contact with the surface, distal from the base substrate, of the first defining layer; and
   the display panel further comprises a second defining layer disposed on a side, distal from the base substrate, of the flat layer, the second defining layer is configured to define a plurality of pixel regions, and each sub-pixel is disposed in one of the plurality of pixel regions.

* * * * *